US008289098B2

(12) United States Patent
Chang et al.

(10) Patent No.: US 8,289,098 B2

(45) Date of Patent: Oct. 16, 2012

(54) GATE PULSE MODULATION CIRCUIT AND SLOPING MODULATION METHOD THEREOF

(75) Inventors: Meng-Sheng Chang, Hsin-Chu (TW); Chia-Tsung Chaing, Hsin-Chu (TW)

(73) Assignee: Au Optronics Corp., Hsinchu (TW)

( * ) Notice: Subject to any disclaimer, the term of this patent is extended or adjusted under 35 U.S.C. 154(b) by 226 days.

(21) Appl. No.: 12/941,525

(22) Filed: Nov. 8, 2010

(65) Prior Publication Data

US 2011/0316640 A1 Dec. 29, 2011

(30) Foreign Application Priority Data

Jun. 23, 2010 (TW) .............................. 99120534 A

(51) Int. Cl.
*H03K 6/00* (2006.01)

(52) U.S. Cl. ....................................... 332/116; 332/115

(58) Field of Classification Search .................. 332/116, 332/115

See application file for complete search history.

(56) References Cited

U.S. PATENT DOCUMENTS 4,504,804 A * 3/1985 Chang et al. .................. 332/116
4,507,626 A * 3/1985 Chang et al. .................. 332/116

FOREIGN PATENT DOCUMENTS

TW 200823845 6/2008

* cited by examiner

*Primary Examiner* — Joseph Chang

(74) *Attorney, Agent, or Firm* — WPAT PC; Justin King

(57) ABSTRACT

Exemplary gate pulse modulation circuit and sloping modulation method applied thereto are provided. The gate pulse modulation circuit has an output terminal and includes a voltage modulation circuit and a comparator control circuit. The voltage modulation circuit is electrically coupled between a gate power supply voltage and a second voltage and subjected to the control of a sloping control signal to perform a sloping operation and then output a sloped voltage signal. The comparator control circuit includes a comparing unit and a switching unit. First and second input terminals of the comparing unit respectively are electrically coupled to a node and a first voltage. During the voltage modulation circuit performing the sloping operation, a magnitude relationship between a voltage on the node and the first voltage decides on-off states of the switching unit and thereby decides the moment of the first voltage delivered to the output terminal.

14 Claims, 3 Drawing Sheets

GATE PULSE MODULATION CIRCUIT AND SLOPING MODULATION METHOD THEREOF

BACKGROUND

1. Technical Field

The present invention generally relates to display fields and, particularly to a gate pulse modulation circuit and a sloping modulation method adapted thereto.

2. Description of the Related Art

Nowadays, a driving method of a thin film transistor liquid crystal display (TFT-LCD) device is using a gate pulse signal to drive each pixel transistor for controlling on-off states of each pixel. When a gate pulse signal is inputted to switch on the pixel transistor, a data signal desired to be displayed will be delivered to the pixel through the pixel transistor. If the pixel transistor is switched off, the data signal desired to be displayed would not be delivered to the pixel through the pixel transistor.

In a pixel array of a display panel, each pixel can be considered to be constituted by an equivalent resistor and an equivalent capacitor. In such situation, a front-end inputted waveform and a rear-end waveform on a same scan line associated with each gate pulse signal scanning are different from each other, termed as waveform distortion (reasons for the signal distortion are relevant to high frequency components in the signal are filtered off by the resistor-capacitor low pass filter), Accordingly, it is necessary to modulate e.g., sloping the gate pulse signal, so that the front-end inputted waveform and the rear-end waveform on each scan line are approximately the same, so as to relieve the image flicker phenomenon caused by different feed through voltages on the front-end and the rear-end.

In the prior art, a gate pulse modulation circuit has been proposed to carry out a sloping modulation applied to a gate power supply voltage signal, so as to obtain a sloped voltage signal and output the sloped voltage signal to a gate driver for deciding the waveform of a modulated gate pulse signal. In particular, as illustrated in FIG. 1, an internal circuit diagram of a gate pulse modulation circuit in the prior art is shown. The gate pulse modulation circuit 50 includes a voltage modulation circuit 52 and a diode D0. The voltage modulation circuit 52 is electrically coupled between a gate power supply voltage VGH and a ground voltage AVSS and subjected to the control of a sloping control signal YV1C to alternately switch on internal transistors Mp, Mn, so as to carry out a sloping operation and thereby output a sloped voltage signal VGHM on an output terminal 51 of the gate pulse modulation circuit 50. A positive electrode of the diode D0 is electrically coupled to a power supply voltage AVDD, and a negative electrode of the diode D0 is electrically coupled to a node n1 in the voltage modulation circuit 52. Herein, the gate power supply voltage VGH is provided from a charge pump circuit 100, the sloped voltage signal VGHM is supplied to the gate driver 200 for the use of gate pulse modulation, and the node n1 is arranged at the source of the transistor Mn and electrically coupled to the ground voltage AVSS through a discharge resistor Radj.

Referring to FIG. 2, a measured waveform diagram of a gate pulse signal generated from the gate driver 200 as illustrated in FIG. 1 is shown. The prior art use the conduction characteristics of the diode D0 that being on when forward-biased and off when reverse-biased, to periodically deliver the power supply voltage AVDD to the output terminal 51 of the gate pulse modulation circuit 50, so as to control the lower limit of the sloped voltage signal VGHM (i.e., corresponding to the portion circled by a dashed circle in FIG. 2). However, it is found in FIG. 2 that the lower limit of the sloped voltage signal VGHM is not a constant value, one of reasons may be that the lower limit is influenced by the inherent conduction characteristic of the diode D0, so that the image flicker phenomenon could not be effectively improved. Accordingly, it is necessary to propose an improved gate pulse modulation circuit, a lower limit of a sloped voltage signal outputted therefrom would not be effected by the conduction characteristic of diode in the prior art and can keep unchanged, so that the image flicker phenomenon can be improved.

BRIEF SUMMARY

The present invention is directed to a gate pulse modulation circuit, adapted to perform a sloping modulation and keep a lower limit of a sloped voltage signal at a constant value.

The present invention is further directed to a sloping modulation method, adapted to keep a lower limit of a sloped voltage signal at a constant value.

More specifically, a gate pulse modulation circuit in accordance with an embodiment of the present invention is adapted for being subjected to the control of a sloping control signal to generate a sloped voltage signal according to a gate power supply voltage and a first predetermined voltage and then output the sloped voltage signal for the use of gate pulse modulation through an output terminal of the gate pulse modulation circuit. In this embodiment, the gate pulse modulation circuit includes a voltage modulation circuit and a comparator control circuit. The voltage modulation circuit is electrically coupled between the gate power supply voltage and a second predetermined voltage and subjected to the control of the sloping control signal to perform a sloping operation in a frequency period of the sloping control signal, and thereby outputs the sloped voltage signal through the output terminal of the gate pulse modulation circuit. The comparator control circuit includes a comparing unit and a first switching unit. The comparing unit includes a first input terminal, a second input terminal and a control terminal. The first input terminal is electrically coupled to a node of the voltage modulation circuit, and the second input terminal is electrically coupled to the first predetermined voltage. The first switching unit includes a first passage terminal, a second passage terminal and a control terminal. The first passage terminal of the first switching unit is electrically to the first predetermined voltage, the second passage terminal of the first switching unit is electrically coupled to the output terminal of the gate pulse modulation circuit, and the control terminal of the first switching unit is electrically coupled to the output terminal of the comparing unit. Moreover, during the voltage modulation circuit performing the sloping operation, a relative magnitude relationship between a voltage on the node and the first predetermined voltage decides on-off states of the first switching unit, and thereby decides the moment of the first predetermined voltage being delivered to the output terminal of the gate pulse modulation circuit.

In one embodiment, the comparator control circuit further includes a second switching unit. Herein, the second switching unit includes a first passage terminal, a second passage terminal and a control terminal. The first passage terminal and the second passage terminal of the second switching unit respectively are electrically coupled to the first predetermined voltage and the first passage terminal of the first switching unit, and the control terminal of the second switching unit is electrically coupled to the sloping control signal so that during the voltage modulation circuit performing the sloping operation the second switching unit is switched on to allow the first predetermined voltage to be delivered to the first passage terminal of the first switching unit.

In one embodiment, the voltage modulation circuit includes a third switching unit and a fourth switching unit. Herein, the third switching unit includes a first passage terminal, a second passage terminal and a control terminal. The first passage terminal of the third switching unit is electrically coupled to the gate power supply voltage, the second passage terminal of the third switching unit is electrically coupled to the output terminal of the gate pulse modulation circuit, and the control terminal of the third switching unit is electrically coupled to the sloping control signal so that the third switching unit is switched off during the voltage modulation circuit performing the sloping operation. The fourth switching unit includes a first passage terminal, a second passage terminal and a control terminal. The first passage terminal of the fourth switching unit is electrically coupled to the second predetermined voltage, the second passage terminal of the fourth switching unit is electrically coupled to the second passage terminal of the third switching unit, and the control terminal of the further switching unit is electrically coupled to the sloping control signal so that the fourth switching unit is switched on during the voltage modulation circuit performing the sloping operation. Moreover, the node is arranged between the first passage terminal of the fourth switching unit and the second predetermined voltage.

In an alternative embodiment, the voltage modulation circuit includes a third switching unit and a fourth switching unit. Herein, the third switching unit includes a first passage terminal, a second passage terminal and a control terminal. The first passage terminal of the third switching unit is electrically coupled to the gate power supply voltage, the second passage terminal of the third switching unit is electrically coupled to the output terminal of the gate pulse modulation circuit, and the control terminal of the third switching unit is electrically coupled to the sloping control signal so that the third switching unit is switched off during the voltage modulation circuit performing the sloping operation. The fourth switching unit includes a first passage terminal, a second passage terminal and a control terminal. The first passage terminal of the fourth switching unit is electrically coupled to the second predetermined voltage, the second passage terminal of the fourth switching unit is electrically coupled to the second passage terminal of the third switching unit, and the control terminal of the fourth switching unit is electrically coupled to the sloping control signal so that the fourth switching unit is switched on during the voltage modulation circuit performing the sloping operation. The node is arranged between the second passage terminal of the fourth switching unit and the second passage terminal of the third switching unit. Furthermore, the comparator control circuit may further include a fifth switching unit. In particular, the fifth switching unit includes a first passage terminal, a second passage terminal and a control terminal. The first passage terminal of the fifth switching unit is electrically coupled to the second passage terminal of the third switching unit, the second passage terminal of the fifth switching unit is electrically coupled to the output terminal of the gate pulse modulation circuit, and the control terminal of the fifth switching unit is electrically coupled to the output terminal of the comparing unit. On-off states of the fifth switching unit are opposite to the on-off states of the first switching unit.

A gate pulse modulation circuit in accordance with another embodiment of the present invention is adapted for being subjected to the control of a sloping control signal to generate a sloped voltage signal according to a gate power supply voltage and a first predetermined voltage and then output the sloped voltage signal for the use of gate pulse modulation through an output terminal of the gate pulse modulation circuit. In this embodiment, the gate pulse modulation circuit includes a voltage provision path, a sloping path, a comparing unit and a first switching unit. The voltage provision path is electrically coupled between the gate power supply voltage and the output terminal of the gate pulse modulation circuit and on-off states of which are decided by the sloping control signal. The sloping path is electrically coupled between a second predetermined voltage and the output terminal of the gate pulse modulation circuit and on-off states of which are decided by the sloping control signal. The on-off states of the sloping path are opposite to that of the voltage provision path. The comparing unit includes a first input terminal and a second input terminal. The first input terminal is electrically coupled to a node on the sloping path, and the second input terminal is electrically coupled to the first predetermined voltage. The first switching unit is electrically coupled between the first predetermined voltage and the output terminal of the gate pulse modulation circuit and subjected to the control of the comparing unit. Moreover, during the sloping path being switched on, a relative voltage magnitude between the first input terminal and the second input terminal of the comparing unit decides the moment of the first switching unit being switched on, and thereby decides when the first predetermined voltage is delivered to the output terminal of the gate pulse modulation circuit through the first switching unit.

In one embodiment, the gate pulse modulation circuit further includes a second switching unit. Herein, the second switching unit is electrically coupled between the first predetermined voltage and the first switching unit and subjected to the control of the sloping control signal to decide when to deliver the first predetermined voltage to the first switching unit.

In one embodiment, the gat pulse modulation circuit still further includes a third switching unit. Herein, the third switching unit is electrically coupled between the sloping path and the output terminal of the gate pulse modulation circuit and subjected to the control of the comparing unit. On-off states of the third switching unit are opposite to that of the first switching unit.

In one embodiment, the voltage provision path includes a fourth switching unit. In particular, the fourth switching unit is electrically coupled between the gate power supply voltage and the output terminal of the gate pulse modulation circuit and on-off states of which are decided the by the sloping control signal. The sloping path includes a fifth switching unit and a resistor. The fifth switching unit and the resistor in series are electrically coupled between the second predetermined voltage and the output terminal of the gate pulse modulation circuit, and on-off states of the fifth switching unit are decided by the sloping control signal. Moreover, the on-off states of the fifth switching unit are opposite to that of the fourth switching unit.

In one embodiment, the node on the sloping path is arranged between the fifth switching unit and the resistor.

In another embodiment, the node on the sloping path is arranged between the fifth switching unit and the output terminal of the gate pulse modulation circuit.

A sloping modulation method in accordance with still another embodiment of the present invention is adapted to a gate pulse modulation circuit. Herein, the gate pulse modulation circuit is for producing a sloped voltage signal and outputting the sloped voltage signal through an output terminal of the gate pulse modulation circuit for the use of gate pulse modulation. In this embodiment, the sloping modulation method includes the following steps of: providing a sloping control signal, wherein a frequency period of the sloping control signal includes a voltage provision period and a sloping control period; during the voltage provision period, maintaining a voltage on the output terminal of the gate pulse modulation circuit at a first voltage; and during the sloping control period, comparing a voltage on an internal node of the gate pulse modulation circuit with a second voltage, making the voltage on the output terminal of the gate pulse modulation circuit be gradually decreased from the first voltage and then be kept unchanged during the second voltage is allowed to be delivered to the output terminal of the gate pulse modulation circuit. Moreover, the internal node is electrically communicated with the output terminal of the gate pulse modulation circuit during the voltage on the output terminal of the gate pulse modulation circuit is gradually decreased, and the second voltage is allowed to be delivered to the output terminal of the gate pulse modulation circuit during the voltage on the internal node is smaller than the second voltage.

In one embodiment, in the sloping modulation method, the internal node is also electrically communicated with the output terminal of the gate pulse modulation circuit during the second voltage is allowed to be delivered to the output terminal of the gate pulse modulation circuit.

In another embodiment, in the sloping modulation method, the internal node is not electrically communicated with the output terminal of the gate pulse modulation circuit during the second voltage is allowed to be delivered to the output terminal of the gate pulse modulation circuit.

In the various embodiments of the present invention, by using the approach of employing the comparing unit to control the switching unit(s) to set the lower limit of the sloped voltage signal, since the switch characteristic of the switching unit(s) is different from the conduction characteristic of diode, the lower limit can be maintained at a constant value by using the switching unit(s) to deliver the first predetermined voltage to the output terminal of the gate pulse modulation circuit. As a result, the issue of the prior art that the sloping path is influenced by the conduction characteristic of diode can be avoided, and thus the image flicker phenomenon can be improved.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

It is to be understood that other embodiment may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings. Accordingly, the descriptions will be regarded as illustrative in nature and not as restrictive.

Figure 1:
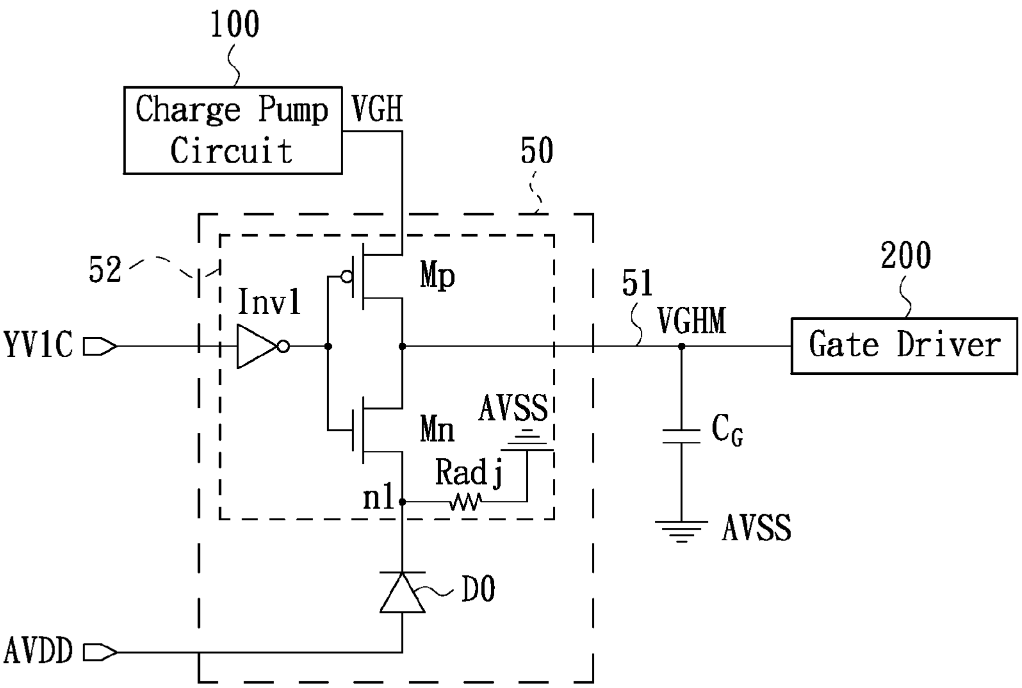
FIG. 1(Related Art)
FIG. 1 shows an internal circuit diagram of a gate pulse modulation circuit in the prior art.
Figure 2:
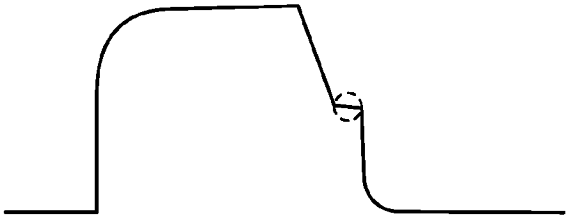
FIG. 2(Related Art)
FIG. 2 shows a measured waveform diagram of a gate pulse signal generated from a gate driver as shown in FIG. 1.
Figure 3:
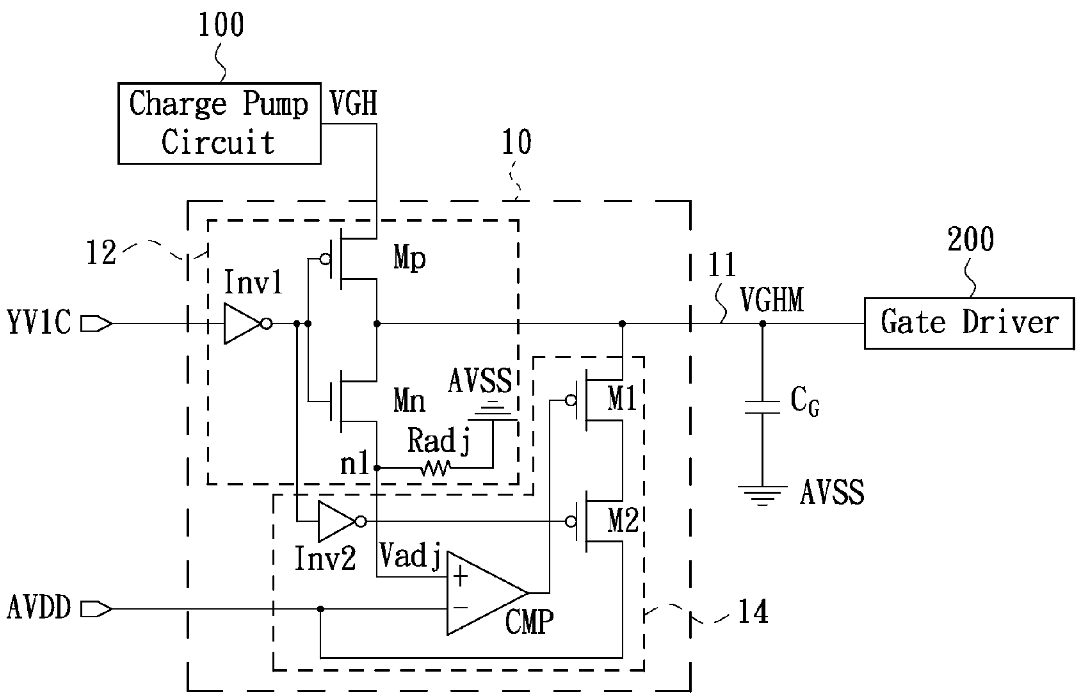
FIG. 3 shows a schematic internal circuit diagram of a gate pulse modulation circuit in accordance with a first embodiment of the present invention.

Referring to FIG. 3, a schematic internal circuit diagram of a gate pulse modulation circuit in accordance with a first embodiment of the present invention is provided.

As illustrated in FIG. 3, the gate pulse modulation circuit 10 is adapted for being subjected to the control of a sloping control signal e.g., YV1C to generate a sloped voltage signal e.g., VGHM according to a gate power supply voltage e.g., VGH and a first predetermined voltage e.g., power supply voltage AVDD and then output the sloped voltage signal VGHM to a gate driver 200 for the use of gate pulse modulation through an output terminal 11 of the gate pulse modulation circuit 10. Herein, the gate power supply voltage VGH can be provided by a charge pump circuit 100, the output terminal 11 of the gate pulse modulation circuit 10 is electrically coupled to the gate driver 200 and further electrically coupled to a second predetermined voltage e.g., ground voltage AVSS through a ground capacitor $C_G$. The gate pulse modulation circuit 10 includes a voltage modulation circuit 12 and a comparator control circuit 14.

The voltage modulation circuit 12 is electrically coupled between the gate power supply voltage VGH and the ground voltage AVSS and includes an inverter Inv1, a P-type transistor Mp, an N-type transistor Mn and a discharge resistor Radj. The source/drain of the P-type transistor Mp is electrically coupled to the gate power supply voltage VGH, the drain/source of the P-type transistor Mp is electrically coupled to the output terminal 11 of the gate pulse modulation circuit 10, and the gate of the P-type transistor Mp is electrically coupled to the sloping control signal YV1C through the inverter Inv1. The source/drain of the N-type transistor Mn is electrically coupled to the ground voltage AVSS through the discharge resistor Radj, the drain/source of the N-type transistor Mn is electrically coupled to the drain/source of the P-type transistor Mp, and the gate of the N-type transistor Mn is electrically coupled to the gate of the P-type transistor Mp. Herein, the P-type transistor Mp and the N-type transistor Mn both are used as switching units, and the gates, sources and drains of which respectively can act as control terminals, first passage terminals and second passage terminals of the switching units. Moreover, the P-type transistor Mp constitutes a voltage provision path, the N-type transistor Mn and the discharge resistor Radj cooperatively constitute a sloping path. Since on-off states of the P-type transistor Mp are opposite to on-off states of the N-type transistor Mn, the voltage provision path and the sloping path are alternately switched on.

The comparator control circuit 14 includes an inverter Inv2, a comparing unit CMP and P-type transistors M1, M2. A first input terminal e.g., the non-inverting input terminal (+)

of the comparing unit CMP is electrically coupled to a node n1 of the voltage modulation circuit 12. Herein, the node n1 is arranged between the source/drain of the N-type transistor Mn and the discharge resistor Radj, and a voltage on which is labeled as Vadj. A second input terminal e.g., the inverting input terminal (−) of the comparing unit CMP is electrically coupled to the power supply voltage AVDD. The source/drain of the P-type transistor M1 is electrically coupled to the output terminal 11 of the gate pulse modulation circuit 10, the gate of the P-type transistor M1 is electrically coupled to the output terminal of the comparing unit CMP so that on-off states of the P-type transistor M1 are subjected to the control of the comparing unit CMP. The source/drain of the P-type transistor M2 is electrically coupled to the drain/source of the P-type transistor M1, the drain/source of the P-type transistor M2 is electrically coupled to the power supply voltage AVDD, and the gate of the P-type transistor M2 is electrically coupled to the sloping control signal YV1C sequentially through the inverters Inv2, Inv1. Herein, the P-type transistors M1, M2 are used as switching units, and the gates, sources and drains of which respectively can act as control terminals, first passage terminals and second passage terminals of the switching units.

Figure 4:
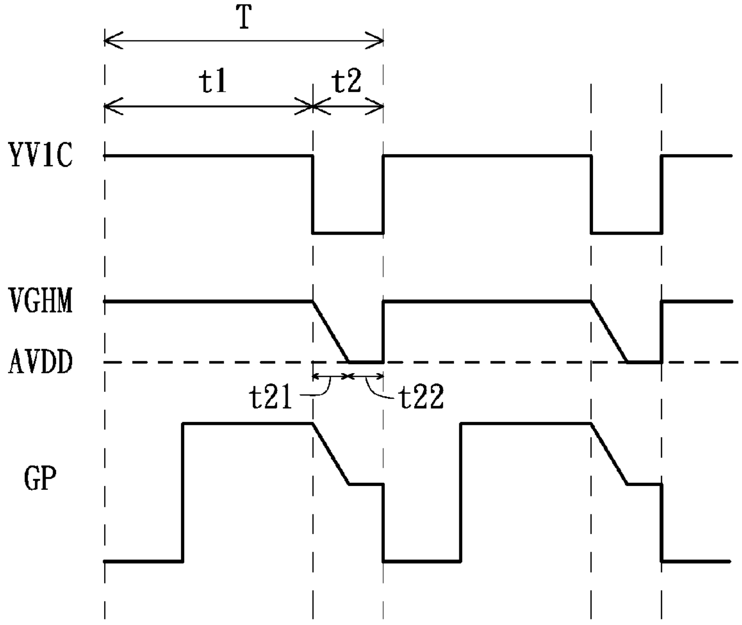
FIG. 4 shows a timing diagram of multiple signals associated with the gate pulse modulation circuit as shown in FIG. 3.

In the following, an operation process of the gate pulse modulation circuit 10 will be described in detail with reference to accompanying drawings FIGS. 3 and 4. FIG. 4 shows a timing diagram of multiple signals YV1C, VGHM and GP associated with the gate pulse modulation circuit 10. Herein, GP represents a gate pulse signal produced from the gate driver 200 according to the sloped voltage signal VGHM.

As illustrated in FIG. 4, each frequency period T e.g., frame period of the sloping control signal YV1C includes a voltage provision period t1 and a sloping control period t2.

During the voltage provision period t1, the sloping control signal YV1C is logic high, the P-type transistor Mp is switched on (i.e., the voltage provision path is switched on), the N-type transistor Mn and the P-type transistor M2 are switched off. At this time, the gate power supply voltage VGH will be delivered to the output terminal 11 of the gate pulse modulation circuit 10 through the switched-on P-type transistor Mp, so that a voltage on the output terminal 11 is kept unchanged and the magnitude of the voltage on the output terminal 11 is decided by the gate power supply voltage VGH. Correspondingly, a voltage of the gate pulse signal GP generated from the gate driver 200 is kept at a constant value.

During the sloping control period t2, the sloping control signal YV1C is logic low, the P-type transistor Mp is switched off, while the N-type transistor Mn and the P-type transistor M2 are switched on. In a sub-period t21 of the sloping control period t2, the N-type transistor Mn and the discharge resistor Radj cooperatively constitute a discharging loop (i.e., the sloping path is switched on). At this time, the voltage on the output terminal 11 of the gate pulse modulation circuit 10 gradually decreases, and the voltage Vadj on the node n1 gradually decreases correspondingly. When the voltage Vadj decreases to be smaller than the power supply voltage AVDD, the voltage Vadj on the non-inverting input terminal (+) of the comparing unit CMP is smaller than the voltage on the inverting input terminal (−), goes to another sub-period t22 of the sloping control period t2. In particular, in the sub-period t22 of the sloping control period t2, the output terminal of the comparing unit CMP outputs a logic low voltage to switch on the P-type transistor M1, the node n1 at this time is electrically coupled communicated with the output terminal 11 of the gate pulse modulation circuit 10, the power supply voltage AVDD will be delivered to the output terminal 11 of the gate pulse modulation circuit 10 sequentially through the P-type transistors M2, M1, so that the voltage on the output terminal 11 will be maintained at AVDD and a sloping operation is completed until now. Correspondingly, during the sloping control period t2, the voltage of the gate pulse signal GP firstly is gradually decreased and then maintained at a constant value.

Furthermore, it is found from the above-described operation process of the gate pulse modulation circuit 10 that, the P-type transistor M2 only is switched on during the sloping control period t2, and thus the use of the P-type transistor M2 can ensure a power-on sequence is not influenced (this is because that when power is on, the voltage on the non-inverting input terminal (+) of the comparing unit CMP may be smaller than the voltage AVDD on the inverting input terminal (−), which would resulting in the P-type transistor M1 is switched on).

Figure 5:
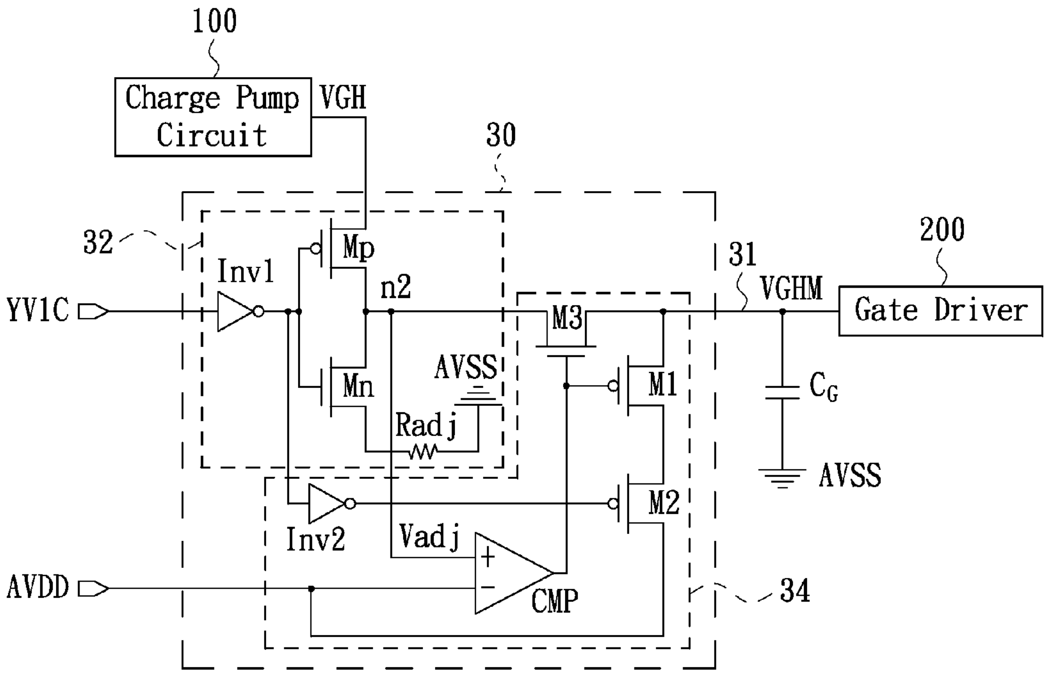
FIG. 5 shows a schematic internal circuit diagram of a gate pulse modulation circuit in accordance with a second embodiment of the present invention.

Referring to FIG. 5, a schematic internal circuit diagram of a gate pulse modulation circuit in accordance with a second embodiment of the present invention is shown.

As illustrated in FIG. 5, the gate pulse modulation circuit 30 is adapted for being subjected to the control of a sloping control signal e.g., YV1C to generate a sloped voltage signal e.g., VGHM according to a gate power supply voltage e.g., VGH and a first predetermined voltage e.g., power supply voltage AVDD and then output the sloped voltage signal VGHM to the gate driver 200 for the use of gate pulse modulation through the output terminal 31 of the gate pulse modulation circuit 30. Herein, the gate power supply voltage VGH can be provided from a charge pump circuit 100, the output terminal 31 of the gate pulse modulation circuit 30 is electrically coupled to the gate driver 200 and further is electrically coupled to a second predetermined voltage e.g., ground voltage AVSS through a ground capacitor $C_G$. The gate pulse modulation circuit 30 includes a voltage modulation circuit 32 and a comparator control circuit 34.

The voltage modulation circuit 32 is electrically coupled between the gate power supply voltage VGH and the ground voltage AVSS and includes an inverter Inv1, a P-type transistor Mp, an N-type transistor Mn and a discharge resistor Radj. The source/drain of the P-type transistor Mp is electrically coupled to the gate power supply voltage VGH, the drain/source of the P-type transistor Mp is electrically coupled to the output terminal 31 of the gate pulse modulation circuit 30, and the gate of the P-type transistor Mp is electrically coupled to the sloping control signal YV1C through the inverter Inv1. The source/drain of the N-type transistor Mn is electrically coupled to the ground voltage AVSS through the discharge resistor Radj, the drain/source of the N-type transistor Mn is electrically coupled to the drain/source of the P-type transistor Mp, and the gate of the N-type transistor Mn is electrically coupled to the gate of the P-type transistor Mp. Herein, the P-type transistor Mp and the N-type transistor Mn both are used as switching units, and the gates, sources and drains of which respectively can act as control terminals, first passage terminals and second passage terminals of the switching units. Moreover, the P-type transistor Mp constitutes a voltage provision path, the N-type transistor Mn and the discharge resistor Radj cooperatively constitute a sloping path. Since on-off states of the P-type transistor Mp are opposite to on-off states of the N-type transistor Mn, the voltage provision path and the sloping path are alternately switched on.

The comparator control circuit 34 includes an inverter Inv2, a comparing unit CMP, P-type transistors M1, M2, and an N-type transistor M3. In particular, a first input terminal e.g., non-inverting input terminal (+) of the comparing unit CMP is electrically coupled to a node n2 in the voltage modulation circuit 32. The node n2 is arranged between the drain/ source of the N-type transistor Mn and the drain/source of the P-type transistor Mp (i.e., arranged at the drain/source side of the N-type transistor Mn on the sloping path), and a voltage on the node n2 is labeled as Vadj. A second input terminal e.g., inverting input terminal (−) of the comparing unit CMP is electrically coupled to the power supply voltage AVDD. The source/drain of the P-type transistor M1 is electrically coupled to the output terminal 31 of the gate pulse modulation circuit 30, and the gate of the P-type transistor M1 is electrically coupled to the output terminal of the comparing unit CMP so that on-off states of the P-type transistor M1 are decided by the comparing unit CMP. The source/drain of the P-type transistor M2 is electrically coupled to the drain/source of the P-type transistor M1, the drain/source of the P-type transistor M2 is electrically coupled to the power supply voltage AVDD, and the gate of the P-type transistor M2 is electrically coupled to the sloping control signal YV1C sequentially through the inverters Inv2, Inv1. The source/drain of the N-type transistor M3 is electrically coupled to the output terminal 31 of the gate pulse modulation circuit 30, the drain/source of the N-type transistor M3 is electrically coupled to the drain/source of the P-type transistor Mp, and the gate of the N-type transistor M3 is electrically coupled to the output terminal of the comparing unit CMP so that on-off states of the N-type transistor M3 are decided by the comparing unit CMP. The on-off states of the N-type transistor M3 are opposite to the on-off states of the P-type transistor M1. Herein, the P-type transistors M1, M2 and the N-type transistor M3 all are used as switching units, and the gates, sources and drains of which respectively can act as control terminals, first passage terminals and second passage terminals of the switching units.

Figure 6:
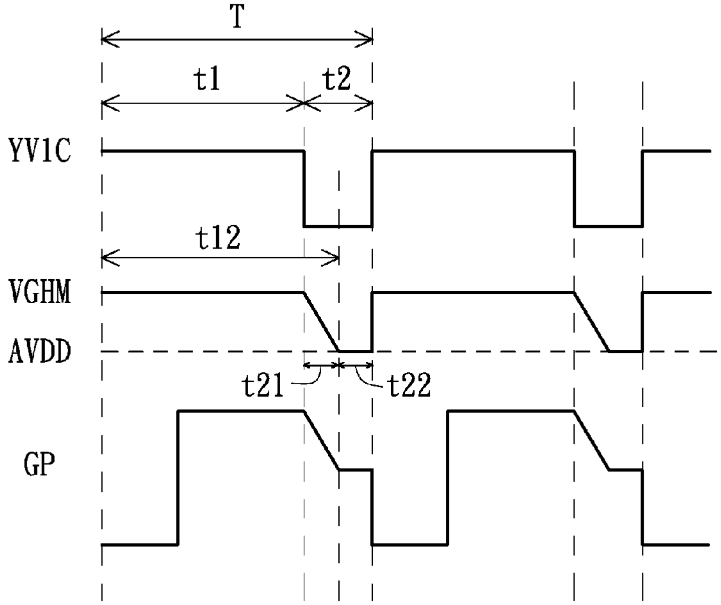
FIG. 6 shows a timing diagram of multiple signals associated with the gate pulse modulation circuit as shown in FIG. 5.

In the following, an operation process of the gate pulse modulation circuit 30 will be described in detail with reference to accompanying drawings FIGS. 5 and 6. FIG. 6 shows a timing diagram of multiple signals YV1C, VGHM and GP associated with the gate pulse modulation circuit 30. Herein, GP represents a gate pulse signal generated by the gate driver 200 according to the sloped voltage signal VGHM.

As illustrated in FIG. 6, each frequency period e.g., frame period of the sloping control signal YV1C includes a voltage provision period t1 and a sloping control period t2.

During the voltage provision period t1, the sloping control signal YV1C is logic high, the P-type transistor Mp is switched on (i.e., the voltage provision path is switched on), the N-type transistor Mn and the P-type transistor M2 both are switched off, the voltage Vadj on the node n2 is equal to VGH but greater than AVDD so that the comparing unit CMP outputs a logic high voltage to switch on the N-type transistor M3 but switch off the P-type transistor M1. At this time, the gate power supply voltage VGH will be delivered to the output terminal 31 of the gate pulse modulation circuit 30 through the switched-on P-type transistor MP and N-type transistor M3, so that a voltage on the output terminal 31 is kept unchanged and the magnitude of the voltage on the output terminal 31 is decided by the gate power supply voltage VGH. A voltage of the gate pulse signal GP at this time produced from the gate driver 200 is maintained at a constant value.

During the sloping control period t2, the sloping control signal is logic low, the P-type transistor Mp is switched off, while the N-type transistor Mn and P-type transistor M2 are switched on. In a sub-period t21 of the sloping control period t2, the N-type transistor Mn and the discharge resistor Radj cooperatively constitute a discharging loop (i.e., the sloping path is switched on), the N-type transistor M3 still is switched on, the voltage on the output terminal 31 of the gate pulse modulation circuit 30 at this time is gradually decreased, and the voltage Vadj on the node n2 is gradually decreased correspondingly. When the voltage Vadj is decreased to be smaller than the power supply voltage AVDD, the voltage Vadj on the non-inverting input terminal (+) of the comparing unit CMP is smaller than the voltage on the inverting input terminal (−), goes to another sub-period t22 of the sloping control period t2. More specifically, in the sub-period t22 of the sloping control period t2, the output terminal of the comparing unit CMP outputs a logic low voltage to switch on the P-type transistor M1 while switch off the N-type transistor M3. The node n2 at this time is not electrically communicated with the output terminal 31 of the gate pulse modulation circuit 30 resulting from the switched-off N-type transistor M3, the power supply voltage AVDD will be delivered to the output terminal 31 of the gate pulse modulation circuit 30 sequentially through the P-type transistors M2, M1, so that the voltage on the output terminal 31 is kept at AVDD and a sloping operation is completed until now. Correspondingly, during the sloping control period t2, the gate pulse signal GP is first gradually decreased and then maintained at a constant value. Furthermore, it is found from the above-described operation process of the gate pulse modulation circuit 30 that, the N-type transistor M3 is continuously switched on in a period t12 of the sloping control signal YV1C, herein the period t12 is the sum of the voltage provision period t1 and the sub-period t21 of the sloping control period t2.

In summary, in the various embodiments of the present invention, by using the approach of employing the comparing unit to control the switching unit(s) to allow the power supply voltage AVDD to be delivered to the output terminal of the gate pulse modulation circuit in a optimum time, since the switch characteristic of switching unit(s) is different from the conduction characteristic of diode, the lower limit of the sloped voltage signal VGHM associated with the present invention can be maintained at a constant value of AVDD. Accordingly, the influence of conduction characteristic of diode occurred in the sloping path associated with the prior art can be eliminated, and thus the image flicker phenomenon in the prior art can be improved.

Additionally, any skilled person in the art can make some modifications/changes to the circuit configuration of the gate pulse modulation circuit in accordance with the various embodiments of the present invention, for example, suitably changing the types (P-type or N-type) of the transistors, omitting the P-type transistor M2 and/or the inverter Inv2 in the comparator control circuit, and so on, as long as such modifications/changes are using the approach of employing comparing unit to control switching unit(s) to set the lower limit of the sloped voltage signal, they ought to be included in the scope and spirit of the present invention.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A gate pulse modulation circuit adapted for being subjected to the control of a sloping control signal to generate a sloped voltage signal according to a gate power supply voltage and a first predetermined voltage and then output the sloped voltage signal through an output terminal of the gate pulse modulation circuit for the use of gate pulse modulation, the gate pulse modulation circuit comprising:

a voltage modulation circuit, electrically coupled between the gate power supply voltage and a second predetermined voltage and subjected to the control of the sloped control signal to perform a sloping operation in a frequency period of the sloping control signal, and thereby the output terminal of the gate pulse modulation circuit outputs the sloped voltage signal; and a comparator control circuit, comprising:

a comparing unit, comprising a first input terminal, a second input terminal and an output terminal, wherein the first input terminal is electrically coupled to a node in the voltage modulation circuit, and the second input terminal is electrically coupled to the first predetermined voltage; and a first switching unit, comprising a first passage terminal, a second passage terminal and a control terminal, the first passage terminal of the first switching unit is electrically coupled to the first predetermined voltage, the second passage terminal of the first switching unit is electrically coupled to the output terminal of the gate pulse modulation circuit, and the control terminal of the first switching unit is electrically coupled to the output terminal of the comparing unit;

wherein during the voltage modulation circuit performing the sloping operation, a relative magnitude relationship between a voltage on the node and the first predetermined voltage decides on-off states of the first switching unit, and thereby decides the moment of the first predetermined voltage being delivered to the output terminal of the gate pulse modulation circuit.

2. The gate pulse modulation circuit as claimed in claim 1, wherein the comparator control circuit further comprises:

a second switching unit, comprising a first passage terminal, a second passage terminal and a control terminal, wherein the first passage terminal of the second switching unit is electrically coupled to the first predetermined voltage, the second passage terminal of the second switching unit is electrically coupled to the first passage terminal of the first switching unit, and the control terminal of the second switching unit is electrically coupled to the sloping control signal so that during the voltage modulation circuit performing the sloping operation the second switching unit is switched on to allow the first predetermined voltage to be deliver the first passage terminal of the first switching unit.

3. The gate pulse modulation circuit as claimed in claim 2, wherein the voltage modulation circuit comprises:

a third switching unit, comprising a first passage terminal, a second passage terminal and a control terminal, wherein the first passage terminal of the third switching unit is electrically coupled to the gate power supply voltage, the second passage terminal of the third switching unit is electrically coupled to the output terminal of the gate pulse modulation circuit, and the control terminal of the third switching unit is electrically coupled to the sloping control signal so that the third switching unit is switched off during the voltage modulation circuit performing the sloping operation; and a fourth switching unit, comprising a first passage terminal, a second passage terminal and a control terminal, wherein the first passage terminal of the fourth switching unit is electrically coupled to the second predetermined voltage, the second passage terminal of the fourth switching unit is electrically coupled to the second passage terminal of the third switching unit, and the control terminal of the fourth switching unit is electrically coupled to the sloping control signal so that the fourth switching unit is switched on during the voltage modulation circuit performing the sloping operation;

wherein the node is arranged between the first passage terminal of the fourth switching unit and the second predetermined voltage.

4. The gate pulse modulation circuit as claimed in claim 1, wherein the voltage modulation circuit comprises:

a third switching unit, comprising a first passage terminal, a second passage terminal and a control terminal, wherein the first passage terminal of the third switching unit is electrically coupled to the gate power supply voltage, the second passage terminal of the third switching unit is electrically coupled to the output terminal of the gate pulse modulation circuit, and the control terminal of the third switching unit is electrically coupled to the sloping control signal so that the third switching unit is switched off during the voltage modulation circuit performing the sloping operation; and a fourth switching unit, comprising a first passage terminal, a second passage terminal and a control terminal, wherein the first passage terminal of the fourth switching unit is electrically coupled to the second predetermined voltage, the second passage terminal of the fourth switching unit is electrically coupled to the second passage terminal of the third switching unit, and the control terminal of the fourth switching unit is electrically coupled to the sloping control signal so that the fourth switching unit is switched on during the voltage modulation circuit performing the sloping operation;

wherein the node is arranged between the second passage terminal of the fourth switching unit and the second passage terminal of the third switching unit.

5. The gate pulse modulation circuit as claimed in claim 4, wherein the comparator control circuit further comprises:

a fifth switching unit, comprising a first passage terminal, a second passage terminal and a control terminal, wherein the first passage terminal of the fifth switching unit is electrically coupled to the second passage terminal of the third switching unit, the second passage terminal of the fifth switching unit is electrically coupled to the output terminal of the gate pulse modulation circuit, the control terminal of the fifth switching unit is electrically coupled to the output terminal of the comparing unit, and on-off states of the fifth switching unit are opposite to the on-off states of the first switching unit.

6. A gate pulse modulation circuit adapted for being subjected to the control of a sloping control signal to generate a sloped voltage signal according to a gate power supply voltage and a first predetermined voltage and then output the sloped voltage signal from an output terminal of the gate pulse modulation circuit for the use of gate pulse modulation, the gate pulse modulation circuit comprising:

a voltage provision path, electrically coupled between the gate power supply voltage and the output terminal of the gate pulse modulation circuit, wherein on-off states of the voltage provision path are decided by the sloping control signal;

a sloping path, electrically coupled between a second predetermined voltage and the output terminal of the gate pulse modulation circuit, wherein on-off states of the sloping path are decided by the sloping control signal and opposite to the on-off states of the voltage provision path;

a comparing unit, comprising a first input terminal and a second input terminal, wherein the first input terminal is electrically coupled to a node in the sloping path, and the second input terminal is electrically coupled to the first predetermined voltage; and a first switching unit, electrically coupled between the first predetermined voltage and the output terminal of the gate pulse modulation circuit and subjected to the control of the comparing unit;

wherein during the sloping path is switched on, a relative voltage magnitude relationship between the first input terminal and the second input terminal of the comparing unit decides the moment of switching on the first switching unit and thereby decides when the first predetermined voltage is delivered to the output terminal of the gate pulse modulation circuit through the first switching unit.

7. The gate pulse modulation circuit as claimed in claim 6, further comprising:

a second switching unit, electrically coupled between the first predetermined voltage and the first switching unit and subjected to the control of the sloping control signal to decide when to deliver the first predetermined voltage to the first switching unit.

8. The gate pulse modulation circuit as claimed in claim 6, further comprising:

a third switching unit, electrically coupled between the sloping path and the output terminal of the gate pulse modulation circuit and subjected to the control of the comparing unit, wherein on-off states of the third switching unit are opposite to the on-off states of the first switching unit.

9. The gate pulse modulation circuit as claimed in claim 6, wherein:

the voltage provision path comprises a fourth switching unit, the fourth switching unit is electrically coupled between the gate power supply voltage and the output terminal of the gate pulse modulation circuit and on-off states of the fourth switching unit are decided by the sloping control signal; and the sloping path comprises a fifth switching unit and a resistor, the fifth switching unit and the resistor in series electrically coupled between the second predetermined voltage and the output terminal of the gate pulse modulation circuit, on-off states of the fifth switching unit are decided by the sloping control signal and opposite to the on-off states of the fourth switching unit.

10. The gate pulse modulation circuit as claimed in claim 9, wherein the node in the sloping path is arranged between the fifth switching unit and the resistor.

11. The gate pulse modulation circuit as claimed in claim 9, wherein the node in the sloping path is arranged between the fifth switching unit and the output terminal of the gate pulse modulation circuit.

12. A sloping modulation method adapted to a gate pulse modulation circuit, the gate pulse modulation circuit being for generating a sloped voltage signal and then outputting the sloped voltage signal from an output terminal of the gate pulse modulation circuit for the use of gate pulse modulation; the sloping modulation method comprising steps of:

providing a sloping control signal, a frequency period of the sloping control signal including a voltage provision period and a sloping control period;

during the voltage provision period, maintaining a voltage on the output terminal of the gate pulse modulation circuit at a first voltage; and during the sloping control period, comparing a voltage on an internal node of the gate pulse modulation circuit with a second voltage, and making the voltage on the output terminal of the gate pulse modulation circuit be gradually decreased from the first voltage and then be kept unchanged during the second voltage is allowed to be delivered to the output terminal of the gate pulse modulation circuit;

wherein the internal node is electrically communicated with the output terminal of the gate pulse modulation circuit during the voltage on the output terminal is gradually decreased, and the second voltage is allowed to be delivered to the output terminal of the gate pulse modulation circuit during the voltage on the internal node is smaller than the second voltage.

13. The sloping modulation circuit as claimed in claim 12, wherein the internal node still is electrically communicated with the output terminal of the gate pulse modulation circuit during the second voltage is allowed to be delivered to the output terminal of the gate pulse modulation circuit.

14. The sloping modulation method as claimed in claim 12, wherein the internal node is not electrically communicated with the output terminal of the gate pulse modulation circuit during the second voltage is allowed to be delivered to the output terminal of the gate pulse modulation circuit.

* * * * *